United States Patent
Hong

(10) Patent No.: US 8,945,682 B2
(45) Date of Patent: Feb. 3, 2015

(54) DEPOSITION APPARATUS, METHOD FOR MANUFACTURING ORGANIC LIGHT EMITTING DISPLAY APPARATUS, AND ORGANIC LIGHT EMITTING DISPLAY APPARATUS

(71) Applicant: Samsung Display Co., Ltd., Yongin, Gyeonggi-Do (KR)

(72) Inventor: Heung-Ki Hong, Yongin (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 14/040,334

(22) Filed: Sep. 27, 2013

(65) Prior Publication Data
US 2014/0339512 A1    Nov. 20, 2014

(30) Foreign Application Priority Data
May 16, 2013 (KR) .......................... 10-2013-0056040

(51) Int. Cl.
B05B 13/02 (2006.01)
H01L 51/56 (2006.01)

(52) U.S. Cl.
CPC ............ *B05B 13/0221* (2013.01); *H01L 51/56* (2013.01); *B05B 13/02* (2013.01)
USPC ...................... 427/424; 427/427.6; 427/427.7

(58) Field of Classification Search
CPC .. B05B 13/02; B05B 13/0221; B05B 13/0285
USPC ...................... 427/424, 427.6, 427.7
See application file for complete search history.

(56) References Cited

U.S. PATENT DOCUMENTS

| 4,501,527 | A | * | 2/1985 | Jacoby et al. ............ 414/222.13 |
| 6,027,766 | A | * | 2/2000 | Greenberg et al. ............ 427/226 |
| 6,558,750 | B2 | * | 5/2003 | Gramarossa et al. ........ 427/430.1 |
| 6,832,863 | B2 | * | 12/2004 | Sugimoto et al. .............. 396/611 |
| 2003/0091410 | A1 | * | 5/2003 | Larson et al. ................. 414/217 |
| 2003/0232563 | A1 | | 12/2003 | Kamiyama et al. |
| 2005/0161159 | A1 | * | 7/2005 | Yamada et al. .......... 156/345.31 |
| 2006/0174829 | A1 | | 8/2006 | An et al. |
| 2009/0081883 | A1 | * | 3/2009 | Freeman et al. .............. 438/765 |
| 2010/0186669 | A1 | * | 7/2010 | Shin et al. ..................... 118/719 |
| 2011/0052791 | A1 | | 3/2011 | Jo et al. |
| 2011/0265725 | A1 | * | 11/2011 | Tsuji et al. .................... 118/725 |

FOREIGN PATENT DOCUMENTS

| KR | 1020120075143 | 7/2012 |
| KR | 10-1174877 | 8/2012 |

* cited by examiner

*Primary Examiner* — Allan R Wilson
(74) *Attorney, Agent, or Firm* — Innovation Counsel LLP

(57) ABSTRACT

A deposition apparatus includes a first transporting unit configured to transport moving units, to which substrates may be detachably affixed, in a first direction; and a second transporting unit configured to transport empty moving units, from which the respective substrates have been detached, in a return direction opposite to the first direction, wherein the moving units are transported cyclically in reusing fashion.

8 Claims, 7 Drawing Sheets

DEPOSITION APPARATUS, METHOD FOR MANUFACTURING ORGANIC LIGHT EMITTING DISPLAY APPARATUS, AND ORGANIC LIGHT EMITTING DISPLAY APPARATUS

CROSS-REFERENCE TO RELATED PATENT APPLICATION

This application claims the benefit of Korean Patent Application No. 10-2013-0056040, filed on May 16, 2013, in the Korean Intellectual Property Office, the disclosure of which application is incorporated herein in its entirety by reference.

BACKGROUND

1. Field of Disclosure

The present disclosure of invention relates to a deposition apparatus, a method of manufacturing an organic light emitting display device (OLEDD), and an organic light emitting display device. The disclosure relates more particularly to a deposition apparatus which is expected to significantly reduce maintenance time thereof, to a method of manufacturing an organic light emitting display device (OLEDD), and to an organic light emitting display device manufactured with use of the deposition apparatus.

2. Description of Related Technology

From among various display devices, the organic light emitting display device (OLEDD) typically features wide viewing angle, excellent contrast, and fast response time, thus being spotlighted as a next-generation display apparatus.

An organic light emitting display device generally has a structure in which an intermediate layer includes an emission layer interposed between a first electrode and a second electrode facing each other. Here, the first electrode, the second electrode, and the intermediate layer may be formed by using any of various methods, e.g., different kinds of deposition methods. In one manufacturing method for an organic light emitting display device using a deposition method, a fine metal mask (FMM) having an opening whose pattern is identical/similar to that of a desired intermediate layer is closely attached to a substrate on which the intermediate layer is to be formed and materials for forming the intermediate layer and/or other layers are deposited through the close-contact mask and onto the substrate, thereby forming the intermediate layer having a predetermined pattern.

However, this deposition method of using a FMM requires a large-scale (large dimensioned) FMM to manufacture a correspondingly large-scaled organic light emitting display apparatus on a correspondingly large-scaled substrate. Alternatively, such a large-scaled FMM may be used to manufacture a plurality of smaller organic light emitting display devices while using a large-scaled "mother" substrate. In the case of large-scaled FMM's, due to weight when being lowered toward a face-up working surface of the substrate; the FMM may warp (e.g., droop) due to its own weight and then further warp as it contacts the face-up working surface of the substrate, and thus it becomes difficult to consistently form an intermediate layer having a precise preset pattern. Furthermore, a significant period of time may be wasted for aligning and for closely-attaching a large-scaled FMM to a corresponding large-scaled substrate at the start of the process and for nondestructively separating the FMM and the face-up working surface of the substrate from each other after the deposition completes. As a result, the overall manufacturing time increases and production efficiency is deteriorated.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a deposition apparatus featuring significantly reduced maintenance and repair times for mass producing batches of essentially same organic light emitting devices.

According to an aspect of the present disclosure, there is provided a deposition apparatus including a transporting unit, where the latter includes a forward-trip first transporting unit configured to transport non-empty moving units to which respective substrates are detachably affixed; and a return-trip second transporting unit configured to transport empty moving units, from which respective substrates have been detached, in a direction opposite to the first direction, wherein the moving units are transported cyclically in a resources reusing fashion by the combination of the first and second transporting units; a loading unit configured to fix the substrates to respective ones of the moving units; a deposition unit, which includes one or more deposition assemblies, which are kept a predetermined distance apart from the substrates and are configured to deposit corresponding material layers onto the substrates while the first transporting unit is transporting the substrates past the deposition assemblies; and a chamber; an unloading unit configured to detach the substrates from their respective moving units after deposition onto the respective substrates is completed; and a first moving unit stocker, in which a backup moving unit may be accommodated.

The first moving unit stocker is located above the loading unit, below the loading unit, or next to the loading unit.

The first moving unit stocker is capable of accommodating a defective or in need-of-maintenance moving unit, which is detached from the substrate and is transported by the second transporting unit. The first moving unit stocker is capable of discharging a backup moving unit into the loading unit in place of the defective or in need-of-maintenance moving unit. If a problem occurs with a moving unit, which is detached from its substrate and is transported by the second transporting unit, the first moving unit stocker is capable of accommodating the moving unit and discharging the backup moving unit into the loading unit.

The deposition apparatus further includes a second moving unit stocker, which is capable of accommodating one or more empty moving units.

The second moving unit stocker is located above the loading unit, below the loading unit, or next to the loading unit.

When a moving unit, which is detached from its substrate and is transported by the second transporting unit, is accommodated in the second moving unit stocker, the first moving unit stocker responsively discharges a backup moving unit into the loading unit. If a problem occurs with the moving unit, which is detached from the substrate and is transported by the second transporting unit, the second moving unit stocker accommodates the moving unit, and the first moving unit stocker discharges the backup moving unit into the loading unit.

The deposition assembly includes a deposition source configured to discharge a deposition material; a deposition nozzle unit, which is arranged above the deposition source toward the first transporting unit and includes deposition nozzles; and a patterning slit sheet, which is arranged to face the deposition nozzle unit, and wherein the deposition material discharged from the deposition source passes through the patterning slit sheet and is deposited onto the substrate.

According to an aspect of the present disclosure of invention, there is provided a method for manufacturing an organic light emitting display apparatus, the method including transporting moving units, to which respective substrates are detachably affixed, into a chamber by using a first transporting unit; forming a layer by discharging a deposition material onto the substrate from the deposition assembly while the deposition assembly arranged inside the chamber and the substrate are a predetermined distance apart from each other and the first transporting unit transports the substrate relative to deposition assembly; transporting the moving unit, which is detached from the substrate, back by using a second transporting unit; and accommodating the moving unit, which is detached from the substrate and transported by the second transporting unit, in the first moving unit stocker and discharging a backup moving unit in the second moving unit stocker.

If a problem occurs with a given moving unit, which is detached from the substrate and is transported by the second transporting unit, the first moving unit stocker accommodates the moving unit and discharges the backup moving unit into the loading unit.

According to an aspect of the present disclosure of invention, there is provided a method of manufacturing an organic light emitting display apparatus, the method including transporting a moving unit, to which a substrate is fixed, into a chamber by using a first transporting unit, which is arranged to penetrate through the chamber; forming a layer by discharging a deposition material onto the substrate from the deposition assembly while the deposition assembly arranged inside the chamber and the substrate are a predetermined distance apart from each other and the first transporting unit transports the substrate relative to deposition assembly; transporting the moving unit, which is detached from the substrate, back by using a second transporting unit, which is arranged to penetrate through the chamber; accommodating the moving unit, which is detached from the substrate and transported by the second transporting unit, in a second moving unit stocker; and discharging a backup moving unit in the first moving unit stocker.

If a problem occurs with the moving unit, which is detached from the substrate and is transported by the second transporting unit, the second moving unit stocker accommodates the moving unit.

The backup moving unit is discharged after the moving unit, which is detached from the substrate, is accommodated in the second moving unit stocker.

In the forming of the layer, the layer is formed as the substrate is moved relative by the first transporting unit to a deposition assembly, which includes a deposition source, which is capable of discharging a deposition material; a deposition nozzle unit, which is arranged above the deposition source toward the first transporting unit and includes deposition nozzles; and a patterning slit sheet, which is arranged to face the deposition nozzle unit, while the deposition assembly and the substrate are a predetermined distance apart from each other.

According to an aspect of the present disclosure, there is provided an organic light emitting display apparatus including a substrate; a plurality of thin-film transistors (TFT), arranged on the substrate; a plurality of pixel electrodes electrically connected to the TFTs; deposition layers arranged on the pixel electrodes; and a counter electrode arranged on the deposition layers, wherein at least one from among the deposition layers is formed by using the disclosed deposition apparatus.

In brief, plural ones of being processed substrates (or other workpieces) are continuously kept moving through a deposition unit even if a problem occurs with one of the substrate moving units because empty backup moving units are kept within the mass production system and are used to replace the problematic moving units. Thus there is no need to repressurize a vacuum or low pressure chamber in order to substitute a backup moving unit for a defective one. Other aspects of the present disclosure of invention will become apparent from the below detailed description.

BRIEF DESCRIPTION OF THE DRAWINGS

The above and other features and advantages of the present disclosure of invention will become more apparent by describing in detail exemplary embodiments thereof with reference to the attached drawings in which.

DETAILED DESCRIPTION OF THE INVENTION

Figure 1:
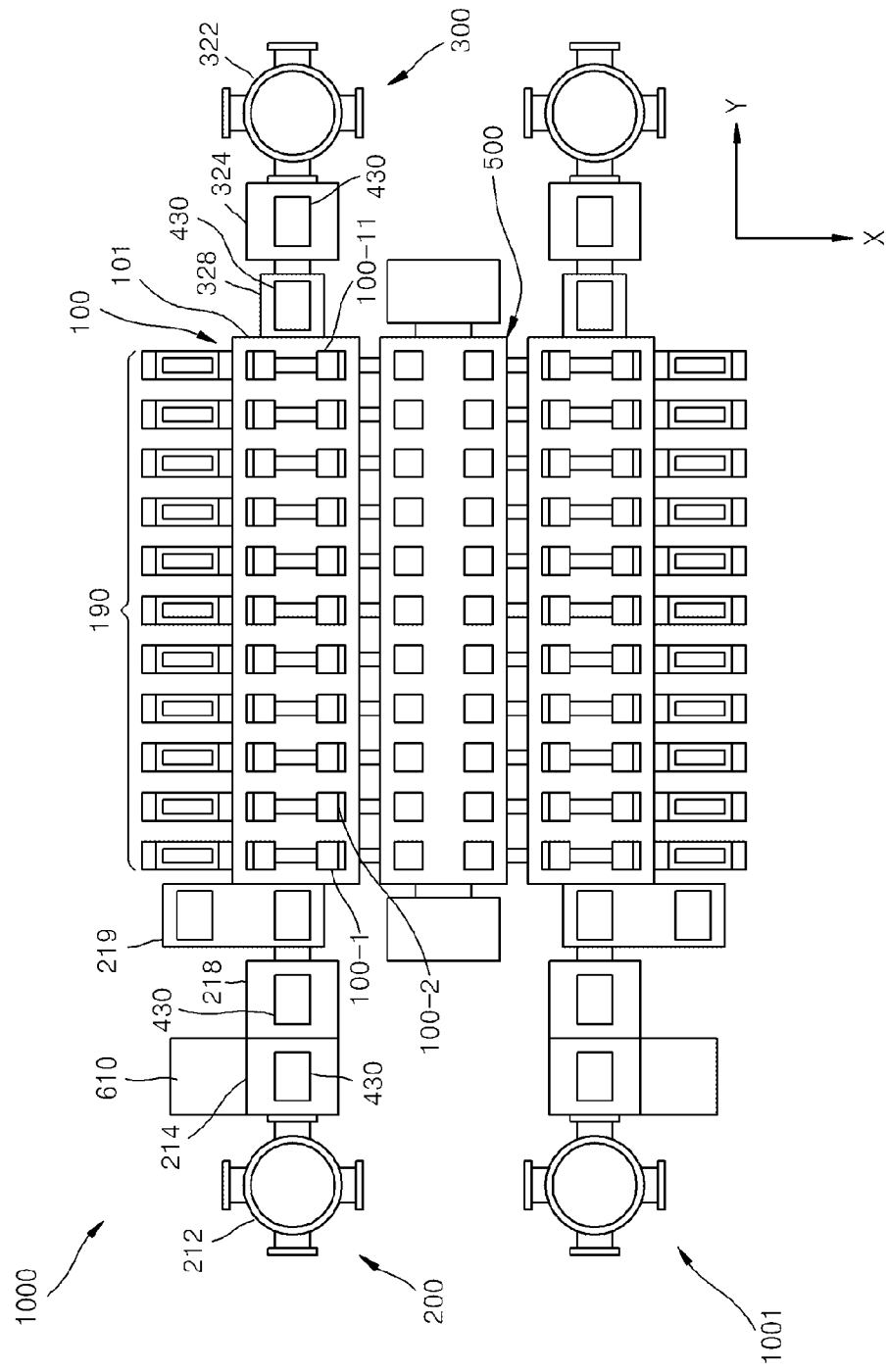
FIG. 1 is a schematic plan view of a deposition apparatus according to an embodiment of the present disclosure.

As used herein, the term "and/or" includes any and all combinations of one or more of the associated listed items.

The present disclosure of invention will now be described more fully with reference to the accompanying drawings, in which exemplary embodiments are shown. The present teachings may, however, be embodied in many different forms and should not be construed as being limited to the embodiments set forth herein; rather, these embodiments are provided so that this disclosure will be thorough and complete, and will fully convey its teachings to those skilled in the art. In the drawings, the thicknesses of layers and regions are exaggerated for clarity.

Hereinafter, the x-axis, the y-axis, and the z-axis are not limited to three axis in the rectangular coordinate system and may be interpreted to a broader term including the definition. For example, the x-axis, the y-axis, and the z-axis may cross one another perpendicularly or may indicate three different directions not crossing one another perpendicularly. For sake of clarity, the positive z-axis will be understood herein to be pointing toward the sky, in other words, opposite to the force direction of gravity.

It will also be understood that when a layer is referred to as being "on" another layer or substrate, it can be directly on the other layer or substrate, or intervening layers may also be present.

Figure 2:
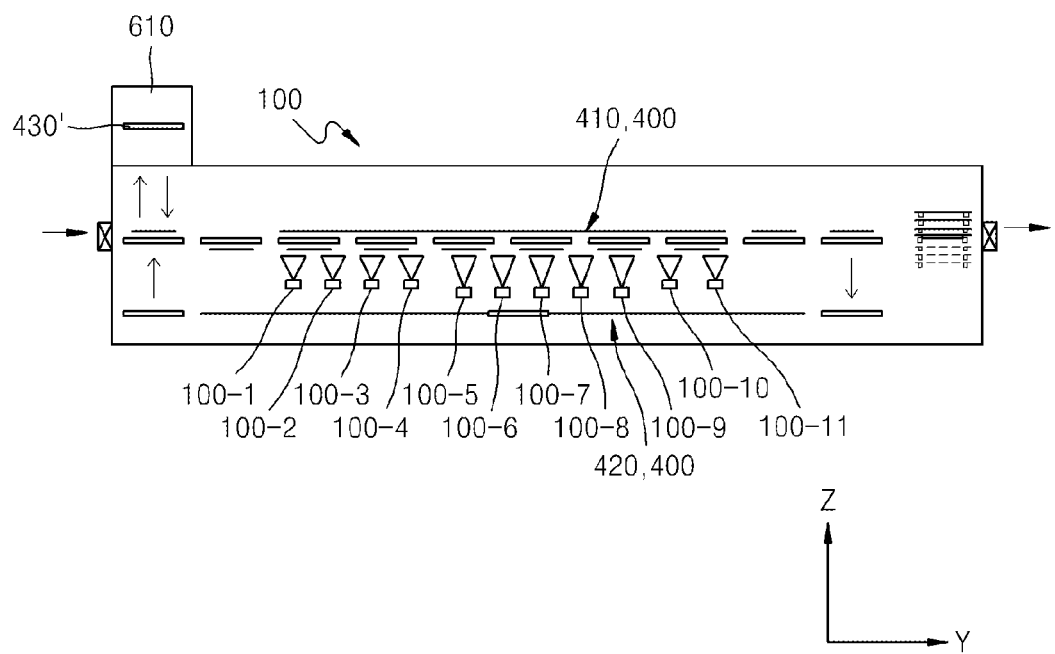
FIG. 2 is a schematic sectional view of a deposition unit of the deposition apparatus of FIG. 1.

FIG. 1 is a schematic top plan view (showing the x and y axes) of a deposition apparatus according to a first embodiment in accordance with the present disclosure. FIG. 2 is a schematic sectional view of a deposition unit 100 provided within the deposition apparatus (1000) of FIG. 1.

Referring to FIGS. 1 and 2, the illustrated deposition apparatus 1000 includes one or more deposition flow-through units 100, a corresponding one or more workpiece loading units 200 (shown to the left of the respective deposition unit 100), a corresponding one or more unloading units 300 (shown to the right of the respective deposition unit 100), a transporting unit 400, a first moving unit stocker 610, and a patterning slit replacing unit 500. The transporting unit 400 includes a first transporting unit 410 (e.g., conveyor means), which is capable of transporting a moving unit 430 having detachably attached thereon a correspondingly-attached substrate 2 (refer to FIG. 3) in a first direction (e.g., the positive Y direction), and a second transporting unit 420, which is capable of transporting the moving unit 430 from which the corresponding substrate 2 is detached in a return direction (e.g., the negative Y direction) opposite to the first direction. In one embodiment, the number of moving units 430 contained within the chamber 100 at a given time may be less than the number of substrates processed as a batch simultaneously within the chamber 100 and the moving units 430 are recycled for use so that all the substrates of a given batch may be processed under essentially identical conditions even though the number of available moving units 430 is less than the number of substrates processed as a batch simultaneously.

The loading unit 200 may include a first workpiece stacking rack 212, an introduction chamber 214, a first face-up to face-down orientation reversing chamber 218, and a buffer chamber 219.

A plurality of input substrates 2 (those in a state prior to deposition) are vertically stacked in the first workpiece stacking rack 212 in a working surface face-up state. An introduction robot picks up the substrates 2 from the first rack 212. The second transporting unit 420 transports the picked up substrates 2 and mounts the substrates 2 each face-up on a respective substrate moving unit 430 (a.k.a. clamping transport palette) that is pre-located in the introduction chamber 214. The non-work bottom surfaces of the substrates 2 may be fixed to the clamping (e.g., an electrostatic chuck type) top surfaces of their respective moving units 430 via a topside clamp (e.g., an electrostatic one) of the moving unit, for example, and the moving units 430 to which the respective substrates 2 are fixed are then moved to the first orientation reversing chamber 218. Of course, the substrates 2 may be aligned to their respective moving units 430 before the substrates 2 are fixed (clamped) to the moving units 430, if required.

In the first orientation reversing chamber 218 located adjacent to the introduction chamber 214, a first reversing robot reverses the top-surface-up orientation of the moving unit 430. In other words, the introduction robot mounts the substrates 2 on the top surface of the moving unit 430, and, while non-work surfaces of the substrates 2 opposite to the to-be-worked-on surfaces of the substrates 2 are facing the moving unit 430, the moving unit 430 is transported to the first orientation reversing chamber 218. As the first reversing robot reverses the top-facing-up orientation of the first reversing chamber 218, the to-be-worked-on surfaces of the substrates 2 now face downward. Using this upside down state, the first transporting unit 410 transports (conveys, e.g., in a conveyor belt fashion) the moving unit 430 to which the respective substrates 2 are now affixed on the down facing surfaces of the moving units 430 such that the to-be-worked-on surfaces of the substrates 2 are also facing down (in the negative Z direction).

The configuration of the unloading unit 300 is the opposite of the configuration of the loading unit 200 described above. In other words, the substrates 2 and the moving unit 430, which have passed through the deposition unit 100 and have been processed in the deposition unit 100 while having their working surfaces face-down, have their orientation again reversed, this time by a second reversing robot in a second reversing chamber 328 whereafter they are transported to a discharging chamber 324. In the discharging chamber 324, the substrates 2 are detached (e.g., unclamped) from their respective moving units 430 and are re-stacked into a second vertical stacking rack 322. Then the second transporting unit 420 transports the empty moving units 430 which are detached from their just moved substrates 2 back in the -Y direction to the loading unit 200. In FIG. 2, a stacked group of processed substrates in face-up working surface states are shown collected at the far right side of the interior of the chamber 100. It is to be noted that the length of the chamber 100 and its included transporting unit 400 in the Y direction is sufficiently long to accommodate a plurality of substrates 2 and their supporting moving units 430 even in the case where the substrates 2 are relatively long (in the Y direction, for example 40 inches or longer).

The present teachings are not limited to the above-stated configuration wherein the substrates are introduced into the chamber in working surface face-up states. Instead, the substrates 2 may be initially fixed to the bottom surface of the moving unit 430 and may be transported as such with their working surfaces already face-down and thus without need for reversal of the working surface orientation. In this case, the first reversing robot in the first reversing chamber 218 and the second reversing robot in the second reversing chamber 328 may not be necessary. Furthermore, the first reversing robot in the first reversing chamber 218 and the second reversing robot in the second reversing chamber 328 may directly reverse the moving unit 430 to which the substrates 2 are fixed inside the first reversing chamber 218 and inside the second reversing chamber 328 instead of respectively reversing the whole of the first reversing chamber 218 and the whole of the second reversing chamber 328. In this case, when the moving unit 430 to which the substrates 2 are fixed is located on a transporting unit in a reversing chamber, the transporting unit 420 inside the reversing chamber may be rotated by 180 degrees. In this case, the transporting unit in the reversing chamber functions as the first reversing robot or the second reversing robot. Here, the transporting unit 420 inside the orientation reversing chamber may be a part of the first transporting unit 410 or a part of the second transporting unit 420. It is to be understood that the various housing chambers mentioned herein are pre-stage and post-stage clean room type chambers that are used for staging their workpieces for entry into or exit from a vacuum or low pressure processing chamber.

As shown in FIGS. 1 and 2, the deposition unit 100 includes a main processing chamber 101, where a plurality of in-process deposition assemblies 100-1, 100-2, . . . , 100-n may be arranged in the chamber 101 with their respective working surfaces in a face-down orientation. Although FIG. 1 shows that eleven deposition assemblies, that is, first through eleventh deposition assemblies 100-1 through 100-11 are arranged in the chamber 101, the number of deposition assemblies may vary according to the types and/or numbers of deposition materials and/or deposition conditions utilized on the in-process workpieces. The chamber 101 may be maintained in a high vacuum or nearly-vacuum state during performance of the one or more depositions carried out therein.

The first transporting unit 410 transports each moving unit 430 to which a corresponding one or more substrates 2 are detachably affixed to at least an interior of the deposition unit 100 and may also transport the moving unit 430 from the loading unit 200, into the deposition unit 100, and out to the unloading unit 300 in the order stated, whereas the second transporting unit 420 transports the empty moving units 430 from which the respective substrates 2 are detached from the unloading unit 300 back to the loading unit 200. Therefore, the moving unit 430 may be transported back and forth (recycled, circulated) by the combination of the first transporting unit 410 and the second transporting unit 420.

The first transporting unit 410 may be arranged to penetrate through the chamber 101 of the deposition unit 100. The second transporting unit 420 may be arranged to transport the moving units 430 to which the substrates 2 are no longer attached.

Here, the first transporting unit 410 and the second transporting unit 420 may be arranged one above the other rather than side-by-side. Therefore, deposition is made onto the face-down substrates 2 while the moving unit 430 is advanced by the first transporting unit 410, and, after the moving unit 430 is detached from its respective one or more substrates 2 at the unloading unit 300, the empty moving unit 430 is transported back to the loading unit 200 by the second transporting unit 420 which is located vertically below the first transporting unit 410. Therefore, floor space in the fabrication facility may be utilized more efficiently. Alternatively, the second transporting unit 420 may be located above the first transporting unit 410.

Meanwhile, as shown in FIG. 1, the deposition unit 100 may include deposition source replacing units 190 arranged at first ends of the respective first through eleventh deposition assemblies 100-1 through 100-11. Although not shown in detail, the deposition source replacing units 190 may be formed as cassette-type components and may be replaceably withdrawn from the respective first through eleventh deposition assemblies 100-1 through 100-11 to outside. Therefore, deposition sources (refer to 110 of FIG. 3) of the first through eleventh deposition assemblies 100-1 through 100-11 may be easily replaced when they run out of respective deposition materials.

Furthermore, FIG. 1 shows that two substantially same deposition devices 1000, 1001 each including a respective loading unit 200, deposition unit 100, and unloading unit 300 are arranged spaced apart but side-by-side next to each other. In this case, the patterning slit replacing unit 500 may be arranged between the two spaced apart deposition devices 1000, 1001. In other words, by arranging the two deposition devices to share the patterning slit replacing unit 500, floor space may be utilized more efficiently than in a case where the each of two deposition devices each has its own patterning slit replacing unit 500. Here, each of the deposition devices may be interpreted as a deposition apparatus.

The first moving unit stocker 610 accommodates a backup moving unit 430'. If and when there is a problem with a first moving unit 430 transported by the first transporting unit 410 for mating with a substrate or there is a problem with such a moving unit 430 after it has released its substrate and is conveyed by the second transporting unit 420, the backup moving unit 430' may be shuttled into place and utilized in place of the defective moving unit 430. The first moving unit stocker 610 may be located at least in one location above the loading unit 200, below the loading unit 200, and next to the loading unit 200. For example, as shown in FIG. 1, the first moving unit stocker 610 may be located next to the introduction chamber 214, so that the moving unit 430 in the introduction chamber 214 is accommodated in the first moving unit stocker 610 and the backup moving unit 430' in the first moving unit stocker 610 is discharged into the introduction chamber 214. Of course, the first moving unit stocker 610 may be located above the loading unit 200 as shown in FIG. 2.

When there is a problem with a moving unit 430, which is detached from its substrates 2 and is being transported back by the moving unit 430, the first moving unit stocker 610 may accommodate the moving unit 430 and discharge the backup moving unit 430' in place of the first moving unit by means of stocker 610 for return into the loading unit 200. Of course, even if there is no problem with a moving unit 430, which is detached from the substrates 2 and is transported back by the moving unit 430, if depositions are made onto the substrates 2 by using the moving unit 430 for a preset number of times, the first moving unit stocker 610 may proactively accommodate the moving unit 430 before any problem occurs thereat and may discharge the backup moving unit 430' in place of the first moving unit by use of stocker 610 sending return trip moving units into the loading unit 200.

Figure 3:
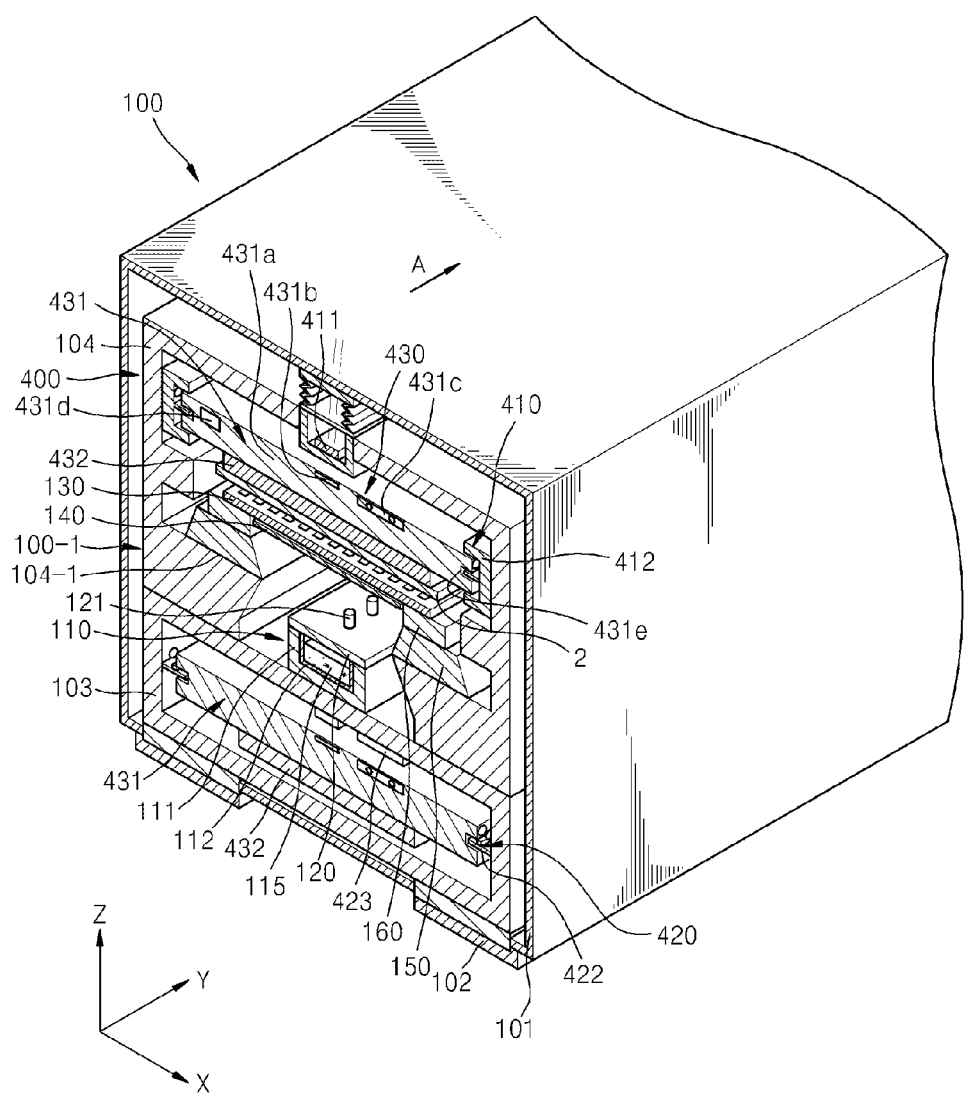
FIG. 3 is a schematic perspective sectional view of a cutaway portion of the deposition unit of the deposition apparatus of FIG. 1.
Figure 4:
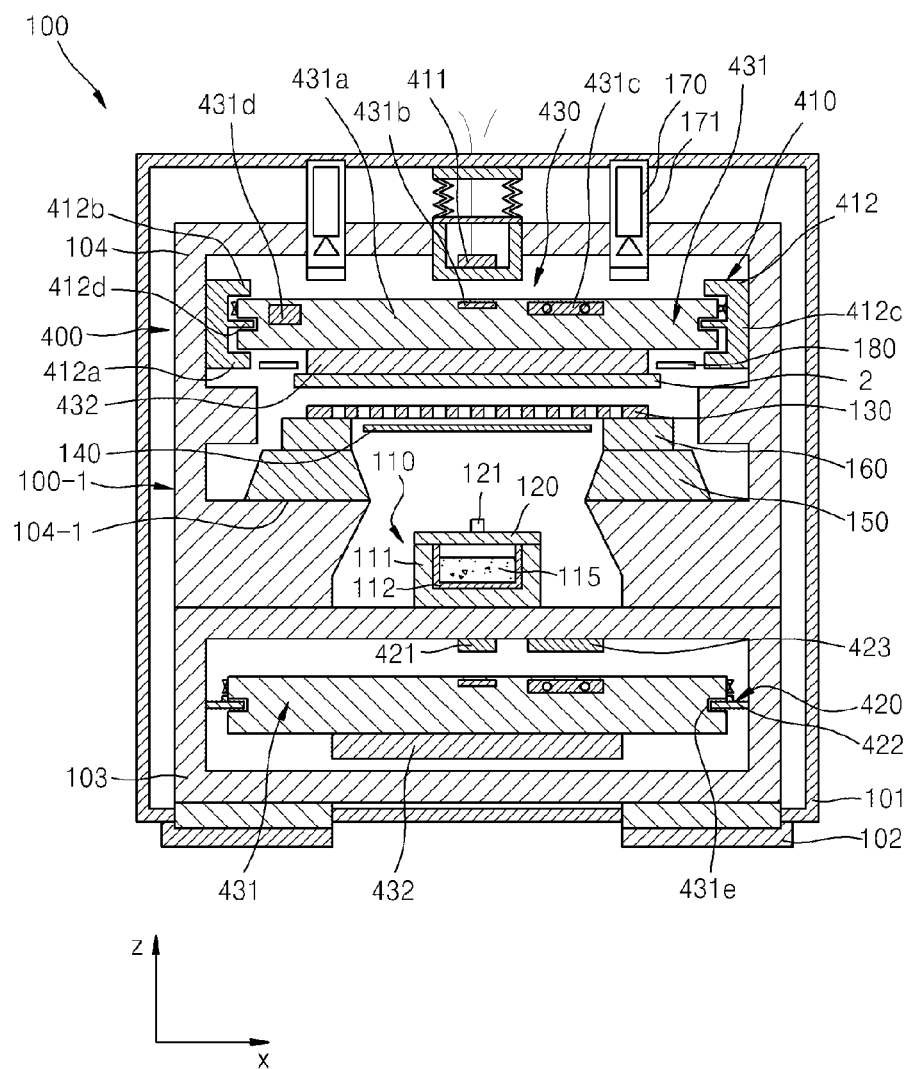
FIG. 4 is a schematic plan sectional view of a portion of the deposition unit of the deposition apparatus of FIG. 1.

FIG. 3 is a schematic perspective sectional view of a portion of the deposition unit 100 of the deposition apparatus of FIG. 1. FIG. 4 is a schematic sectional view of a portion of the deposition unit 100 of the deposition apparatus of FIG. 1. Referring to FIGS. 3 and 4, the deposition unit 100 includes a depressurizable chamber 101 and one or more deposition source insertion assemblies 100-1.

The chamber 101 is formed to have a hollow box-like shape, where one or more deposition assemblies 100-1 are removably accommodated therein and under low pressure (depressurized or vacuum) conditions. Of course, as shown in FIGS. 3 and 4, the transporting unit 400 may also be removably accommodated in the chamber 101 or may be fixed inside and/or extend outside the chamber 101.

In the chamber 101, a lower housing 103 (a.k.a. return trip housing 103) and a upper housing 104 (a.k.a. forward trip housing 104) may be accommodated. In detail, a lower housing 103 may be supported on a set of apparatus supporting feet 102 that may optionally be fixed to the facility floor or ground. The upper housing 104 may be supported above the lower housing 103. Here, portal connections between the lower housing 103 and the chamber 101 may be unsealably sealed, such that the interior of the chamber 101 can be completely isolated from the outside for depressurization and clean processing purposes even as empty moving units 430 are conveyed toward the front end. As described above, since the lower housing 103 and the upper housing 104 are formed on the support feet 102 affixed to the ground (with optional vibrations suppression means), even if the chamber 101 repeatedly contracts and expands due to respective depressurizations and repressurizations), the lower housing 103 and the upper housing 104 inside the chamber 101 may maintain fixed positions relative to one another, and thus the lower housing 103 and the upper housing 104 may function as a reference frame inside the deposition unit 100.

The deposition assemblies 100-1 and the first transporting unit 410 of the transporting unit 400 may be formed in the upper housing 104 (a.k.a. forward trip housing 104), whereas the second transporting unit 420 of the transporting unit 400 may be formed in the lower housing 103. Depositions may be continuously performed as the moving units 430 are moved back and forth respectively by the first transporting unit 410 and the second transporting unit 420. Each moving unit 430 may include a carrier 431 and an electrostatic chuck 432 combined therewith The carrier 431 includes a main body unit 431a, a linear motor system (LMS) magnet 431b, a contactless power supply (CPS) module 431c, a power supply unit 431d, and guiding grooves 431e (that engage with conveyance rails 412d). Meanwhile, the carrier 431 may further include a cam follower, if required.

The main body unit 431a forms the base portion of the carrier 431 and may be formed of a ferromagnetic material, such as iron. The carrier 431 may be supported and aligned to be a predetermined distance apart from sidewalls of the guiding units 412 of the first transporting unit 410 through use of magnetic repulsion between the main body unit 431a of the carrier 431 and maglev bearings (not shown). The guiding grooves 431e may be formed on two opposite surfaces of the main body unit 431a. Furthermore, guiding protrusions 412d (rails) of the guiding units 412 or roller guides 422 of the second transporting unit 420 may be accommodated in the guiding grooves 431e.

Furthermore, a liner-motor-forming, magnetic rail 431b may be formed along a center line of the direction (the y-axis direction) in which the main body unit 431a moves. The magnetic rail 431b of the main body unit 431a and coils 411 of the first transporting unit 410 may be combined with each other to constitute a linear motor, and the carrier 431, that is, the moving unit 430 may be moved in the direction A by the linear motor. Therefore, even if the moving unit 430 does not include an internal power supply unit, the moving unit 430 may be transported by using a current applied to the linear motor coils 411 of the first transporting unit 410. To this end, a plurality of coils 411 may be arranged at a predetermined interval in the chamber 101 (along the y-axis direction). Since the coils 411 are arranged in an atmospheric pressure box, the coils 411 may be arranged in and cooled by the atmosphere.

Meanwhile, the main body unit 431a may include the CPS module 431c and the power supply 431d that are arranged at the two opposite sides of the magnetic rail 431b. The power supply unit 431d includes a rechargeable battery for supplying power to the electrostatic chuck 432 for clamping the substrate 2 and for maintaining the clamping state, whereas the CPU 431c is a wirelessly coupled charging module for used for wirelessly charging the chargeable battery of the power supply unit 431d by using an exterior power source. A wireless charging track 423 is included in the second transporting unit 420 is connected to an inverter (not shown), and, when the carrier 431 is being transported on its return trip by the second transporting unit 420, a magnetic field is formed between the charging track 423 and the CPS module 431c and supplies power to the CPS module 431c, thereby charging the power supply unit 431d.

The electrostatic chuck 432 includes a ceramic body having buried therein electrodes to which high voltage power is applied. The substrate 2 may be attached to a surface of the body of the electrostatic chuck 432 as the power supply unit 431d in the main body unit 431a of the carrier 431 applies a high voltage to the electrodes.

The first transporting unit 410 may transport the moving unit 430 which has a configuration as described above and is having attached thereon (clamped thereto) the substrate 2 in the first direction (+Y direction). The first transporting unit 410 includes the coils 411 and guiding units 412 as described above. The first transporting unit 410 may further include magnetically suspended bearings and gap sensors.

The coils 411 and the guiding units 412 may be arranged on the inner surfaces of the upper housing 104. For example, the coils 411 may be arranged on the inner surfaces of the upper portion of the upper housing 104, whereas the guiding units 412 may be arranged on the two opposite sidewall inner surfaces of the upper housing 104.

As described above, the coils 411 may constitute a linear motor together with the LMS 431b of the main body unit 431 and move the moving unit 430. The guiding units 412 may guide the moving unit 430 to be transported in the first direction (the positive Y-axis direction). The guiding units 412 may be arranged to pass through the deposition unit 100.

In particular, the guiding units 412 have spaces for accommodating both sides of the carrier 431 of the moving unit 430 to guide the carrier 431 to move along in the direction of arrow A illustrated in FIG. 3. In this regard, the guiding units 412 may include a first accommodation part 412a disposed below the carrier 431, a second accommodation part 412b disposed above the carrier 431, and a connection part 412c that connects the first accommodation part 412a and the second accommodation part 412b. A respective guiding groove may be formed in each of the first accommodation part 412a, the second accommodation part 412b, and the connection part 412c, where a guiding protrusion 412d may be formed in the guiding groove.

Magnetically suspended bearings (not shown) are each disposed in the connection part 412c of the guiding units 412 so as to respectively correspond to both sides of the carrier 431. The magnetically suspended bearings cause a spacing distance to be present between the carrier 431 and the guiding units 412 so that the carrier 431 is moved along the guiding units 412 in a non-contact (and thus non-debris forming) manner with the guiding units 412. Each upper magnetically suspended bearing may be disposed in the second accommodation part 412b so as to be above the carrier 431. In this case, the magnetically suspended bearings enable the carrier 431 to be moved along the guide members 412 while not in contact with the first and second accommodation parts 412a and 412b and with a distance therebetween maintained constant. Here, to check the distance between the carrier 431 and the guiding units 412, the guide member 412 may include a gap sensor (not shown), which is arranged at the accommodation part 412 and/or the connection part 412c in correspondence to the lower portion of the carrier 431. Magnetic force of the magnetically suspended bearings may be changed in real time based on values measured by the gap sensor, so as to adjust the distance between the carrier 431 and the guiding units 412 in real time and minimize positioning error. In other words, a precise transfer of the carrier 431 may be feedback controlled using the magnetically suspended bearings and the gap sensors.

The second conveyer unit 420 returns the moving unit 430 from which the substrate 2 has been detached in the unloading unit 300 to the loading unit 200. In this regard, the second conveyer unit 420 may include its own respective coils 421, roller guides 422, and charging track 423. For example, the coils 421 and the charging track 423 may be disposed on a top inner surface of the lower housing 103, and the roller guides 422 may be disposed on both inner sides of the lower housing 103. Although not illustrated, the coils 421 may be disposed in a normal pressure ATM box, as are the coils 411 of the first conveyer unit 410.

Like the coils 411, the coils 421 and the LMS magnet 431b of the main body part 431a of the carrier 431 and the coil 421 may be combined with each other to constitute a linear motor. The carrier 431 may be moved by the linear motor along a return trip direction (−Y direction) opposite to the forward trip or first direction (+Y direction).

The roller guides 422 guide the carrier 431 to move in the direction opposite to the first direction. In this regard, the roller guides 422 may be formed to pass through the deposition unit 100. In particular, the roller guides 422 may support cam followers (not shown) respectively formed on both sides of the carrier 431 of the moving unit 430 to guide the carrier 431 to move along a direction (−Y direction) opposite to the first direction (+Y direction).

The second conveyer unit 420 is used in a process of returning the empty carrier 431 from which the substrate 2 has been detached after the process of depositing organic materials on the substrate 2 has completed. Thus, position accuracy for the empty carrier 431 is not needed in contrast to the case of the first conveyer unit 410. Therefore, magnetic suspension is applied to the first conveyer unit 410 that requires high position accuracy, thereby obtaining position accuracy, and a merely conventional roller method may be applied to the second conveyer unit 420 that requires relatively low position accuracy, thereby reducing manufacturing costs and simplifying a structure of the organic layer deposition apparatus. Of course, if required, the magnetic suspension may also be employed in the second conveyer unit 420 as it is in the first conveyer unit 410.

During deposition, the respective organic layer deposition assemblies 100-1 are kept a predetermined distance apart from the substrate 2. Each deposition assembly 100-1 deposits its respective deposition material onto the face-down working surface of the substrate 2 after the first transporting unit 410 brings the forward transferred substrate 2 and its moving unit 430 into proper spaced apart alignment over the respective deposition assembly 100-1. Hereinafter, constituents of the organic layer deposition assembly 100-1 are described in more detail.

The first organic layer deposition assembly 100-1 includes a respective deposition material source 110, a deposition source nozzle unit 120, a patterning slit sheet 130, a first alignment stage 150, a second alignment stage 160, an alignment verifying camera 170, and an alignment testing sensor 180. In this regard, all the elements illustrated in FIGS. 3 and 4 may be arranged in the chamber 101 maintained in an appropriate vacuum state. This structure is used to achieve the uniformity of deposition of the corresponding deposition material and the consistency of the deposition on a mass production basis from one substrate 2 to the next.

The deposition source 110 may discharge a respective and predetermined deposition material. The deposition source 110 is arranged at the bottom and, as a deposition material 115 is sublimated/vaporized (for example due to controlled heating thereof), the deposition source 110 may discharge the gasified/vaporized deposition material 115 in a direction toward the face-down working surface of the substrate 2 (e.g., discharging in the +Z direction). In detail, the deposition source 110 may include a crucible 111 that is filled with a volatizable deposition material 115 and a heater 112 that heats the crucible 111 so as to vaporize the deposition material 115.

A deposition nozzle unit 120 in which deposition nozzles 121 are formed is arranged above the deposition source 110 and aimed to discharge toward the first transporting unit 410 (+Z direction), that is, toward the substrate 2. In FIG. 3, the deposition nozzle unit 120 includes a plurality of deposition nozzles 121.

The patterning slit sheet 130 may be arranged to be spaced apart from and to face the deposition nozzle unit 120. If a layer to be formed on the substrate 2 is a patterned layer, the patterning slit sheet 130 may have a structure in which one or more patterning slits are formed along a direction (e.g., extending in the X-axis direction). The patterning slit sheet 130 is located between the deposition source 110 and the substrate 2.

The deposition material 115 vaporized from the deposition source 110 may pass through the deposition nozzle unit 120 and the patterning slit sheet 130 and may be deposited onto the substrate 2. Of course, to form a uniform blanket deposition layer on the substrate 2, the patterning slit sheet 130 may have an opening across substantially all of the X-axis direction instead of a plurality of patterning slits and the face-down working surface of the substrate 2 is smoothly advanced in the +Y direction over this X-direction extending slit so that the deposition material is uniformly deposited across substantially the whole of the face-down working surface of the substrate 2.

The patterning slit sheet 130 may be fabricated by using a conventional fine metal mask (FMM), and more particularly, via etching used for fabricating a stripe type mask. The patterning slit sheet 130 may be arranged to be a predetermined distance apart from the deposition source 110 (and the deposition nozzle unit 120 combined therewith).

In particular, in order to deposit the deposition material 115 that has been discharged from the deposition source 110 and passed through the deposition source nozzle unit 120 and the patterning slit sheet 130, onto the substrate 2 in a desired pattern, it is desirable to maintain the chamber (not shown) in a same high vacuum state as that used in a deposition method of an FMM. In addition, cooling should be employed whereby the temperature of the patterning slit sheet 130 is kept sufficiently lower than that of the deposition source 110 (about 100° C. or less) so that thermal expansion warpage of the patterning slit sheet 130 does not occur due to excessive temperatures and thus variation in deposition may be minimized when the temperature of the patterning slit sheet 130 is kept sufficiently low. In other words, if the temperature of the patterning slit sheet 130 rises, sizes or locations of patterning slits in the patterning slit sheet 130 may be changed, and thus the deposition material 115 may be deposited onto the substrate 2 in a pattern different from a design specified and pre-set pattern.

The substrate 2 on which the deposition material 115 is to be deposited is arranged in the chamber 101. The substrate 2 may be a substrate for a flat panel display device. For example, a large substrate, such as a mother glass, for manufacturing a plurality of flat panel displays, may be used as the substrate 2.

As described above, in a conventional deposition method using an FMM, the size of the FMM needs to be the same as that of a substrate. Thus, as the size of the substrate increases, the FMM also needs to be large in size. Due to these problems, it is difficult to fabricate the FMM and to form an intermediate layer in a precise pattern by elongation of the FMM.

However, in the organic layer deposition assembly 100-1 according to one embodiment of the present disclosure, deposition is continuously performed while the substrate 2 is moved (advanced) relative to the organic layer deposition assembly 100-1. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as being continuously moved in the +Y-axis direction in the chamber 101 in FIG. 3 when deposition is performed, the present disclosure of invention is not limited thereto. For example, deposition may alternatively or additionally be performed while the substrate 2 is moved in the −Y direction and/or while the organic layer deposition assembly 100-1 is optionally also moved in the Y-axis direction (where in the latter case, the substrate 2 may be held in a fixed position).

In detail, the predetermined distance by which the deposition assembly 100-1 is kept apart from the substrate 2 as it deposits a material onto the substrate 2 and while the first transporting unit 410 is transporting the substrate 2 affixed to the scanning past moving unit 430 (e.g., scanning in the +Y direction) may vary depending on application. That is, deposition is performed in a scanning manner while the substrate 2, which is arranged to face the deposition assembly 100-1, is moved in a direction of arrow A illustrated in FIG. 3. Although the substrate 2 is illustrated as being moved in the +Y direction in the chamber 101 in FIG. 3 when deposition is performed, the present disclosure of invention is not limited thereto. For example, deposition may be performed while the organic layer deposition assembly 100-1 is moved in the −Y direction and the substrate 2 is held in a fixed position.

Thus, according to the present disclosure, the patterning slit sheet 130 may be much smaller (in the Y direction) than an FMM used in a conventional deposition method. In other words, in the organic layer deposition assembly 100-1, deposition is continuously performed, i.e., in a scanning manner while the substrate 2 is moved in the Y-axis direction. Thus, even if the length of the patterning slit sheet 130 in the Y-axis direction is much smaller than the length of the substrate 2 in the Y-axis, deposition may be sufficiently performed throughout the substrate 2.

Since the patterning slit sheet 130 may be formed much smaller than the FMM used in a conventional deposition method, it is easier to manufacture the narrower patterning slit sheet 130. That is, the small patterning slit sheet 130 is more advantageous in all the manufacturing processes, including etching followed by precise elongation, welding, transferring, and washing processes, than the FMM used in a conventional deposition method. In addition, this is more advantageous for manufacturing a relatively large display device (e.g., for a large screen TV monitor).

Meanwhile, while the first transporting unit 410 transports the substrate 2 fixed to the moving unit 430 in the +Y direction, the deposition assembly 100-1 is a predetermined distance apart from the substrate 2 and deposits a material onto the substrate 2. In other words, the patterning slit sheet 130 is arranged to be a predetermined distance apart from the substrate 2. In a convention deposition apparatus using a FMM, defects may occur as the FMM directly contacts a substrate. However, a deposition apparatus according to the present embodiment may effectively prevent such a problem. Furthermore, a period of time for bringing a substrate and a mask into direct contact with each other is not needed; manufacturing speed may be significantly improved.

The upper housing 104 may include accommodation portions 104-1 that protrude from both sides of the deposition source 110 and the deposition nozzle unit 120, where the first alignment stage 150 and the second alignment stage 160 may be arranged on the accommodation portions 104-1, and the patterning slit sheet 130 may be arranged on the second alignment stage 160.

The first alignment stage 150 may align the patterning slit sheet 130 in the X-axis and/or Y-axis directions. That is, the first alignment stage 150 may include a plurality of actuators (e.g., piezoelectric) so that the patterning slit sheet 130 is moved in the X-axis and/or Y-axis directions with respect to the upper housing 104. The second alignment stage 160 may be formed to align the patterning slit sheet 130 in the Z-axis direction. That is, the second alignment stage 160 may include a plurality of actuators (e.g., piezoelectric) and may move the patterning slit sheet 130 in the Z-axis direction with respect to the first stage 150 and its supporting upper housing 104.

As described above, the patterning slit sheet 130 is moved with respect to the substrate 2 by using the first alignment stage 150 and the second alignment stage 160, into a desired alignment, and in particular, into automatically repeated real-time alignment, so that the spacing between the substrate 2 and the patterning slit sheet 130 may be accurately set and kept even as conditions change minutely.

In addition, the upper housing 104, and sidewall portions of the first alignment stage 150, and the second alignment stage 160 may guide a flow path toward the lowest pressure areas of the vaporized deposition material 115 such that the deposition material 115 which is discharged through the deposition source nozzles 121 is not dispersed outside the desired flow path. That is, the flow path of the deposition material 115 is sealed or constrained by the shapes of the surrounding walls of the upper housing 104, of the first stage 150, and of the second stage 160, and thus, the movement of the deposition material 115 in the X, Y and/or Z-axis directions may be guided thereby.

Meanwhile, the deposition assemblies 100-1 may further include the aforementioned camera 170 and the sensor 180 for assisting in the alignment process. In one embodiment, the sensor 180 includes a confocal sensor. The camera 170 may check a first mark (not shown) formed on the patterning slit sheet 130 and a second mark (not shown) formed on the substrate 2 in real-time and may generate data for precise alignment of the patterning slit sheet 130 and the substrate 2 to each other relative to a predetermined XY plane. The sensor 180 may generate data regarding a distance between the patterning slit sheet 130 and the substrate 2, so as to maintain the patterning slit sheet 130 and the substrate 2 are an appropriate distance apart from each other.

As described above, since a distance between the substrate 2 and the patterning slit sheet 130 is repeatedly measured in real time using the camera 170 and the sensor 180, the substrate 2 may be kept aligned with the patterning slit sheet 130 in real time, whereby position accuracy of the corresponding deposition pattern may be significantly improved.

Meanwhile, a shielding member 140 may be provided around the periphery of the substrate 2 for preventing the volatized organic materials from being undesirably deposited on non-layer forming regions of the substrate 2. This shielding member 140 may further be arranged between the patterning slit sheet 130 and the deposition source 110. Although not shown in detail, the shielding member 140 may include two plates adjacent to each other. Since the non-layer forming region of the substrate 2 is covered by the shielding member 140, deposition of organic materials on the non-layer forming region of the substrate 2 may be easily prevented without a separate structure.

Meanwhile, as described above, the moving unit 430 includes the carrier 431, the electrostatic chuck 432, the main body unit 431a, the LMS 431b, the CPS module 431c, the power supply unit 431d, and/or a cam follower. If a problem occurs with any of the components, and it becomes desirable to fix the problem, then in accordance with the present disclosure, the entire moving unit 430 having the defect is replaced with a known-to be-good substitute moving unit 430'. To replace the moving unit 430, it is necessary to repressurize the interior of the chamber 101, which is maintained in the vacuum state or a nearly-vacuum state during deposition, to atmospheric pressure before discharging the moving unit 430 with the problem out of the chamber 101 and then after the substitute is optionally brought online, changing the interior of the chamber 101 back to in the vacuum state or near-vacuum state again. Furthermore, various problems, such as failure of maintaining an appropriate temperature of the deposition source 110, may occur. Therefore, an excessive period of time may be elapsed to replace the moving unit 430 if done for individualized problems.

However, since a deposition apparatus according to the present embodiment includes the first moving unit stocker 610, such a problem may be efficiently prevented. In other words, the moving unit 430 may be effectively replaced within a short period of time without affecting the deposition source 110 by maintaining the first moving unit stocker 610 at an atmosphere that is the same as or similar to the interior of the chamber 101, discharging the moving unit 430 with the problem directly from the chamber 101 to the first moving unit stocker 610, and discharging the backup moving unit 430' that was held in reserve in the first moving unit stocker 610 into the chamber 101.

Figure 5:
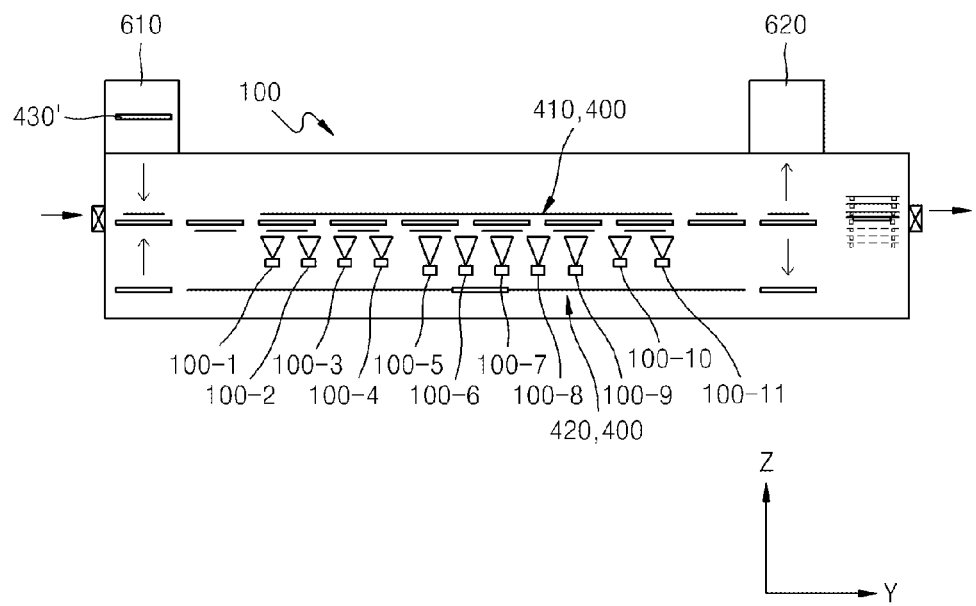
FIG. 5 shows a case in which a second moving unit stocker is located at a location above a discharging chamber.

FIG. 5 is a lateral perspective view of a deposition unit of a deposition apparatus according to another embodiment of the present disclosure.

The deposition apparatus according to the present embodiment includes not only the first moving unit stocker 610, but also a second moving unit stocker 620. The second moving unit stocker 620 may be located at a location which is above the unloading unit (300 of FIG. 1), or below the discharging chamber 324, or next to the discharging chamber 324. FIG. 5 shows a case in which the second moving unit stocker 620 is located at a location above the discharging chamber 324. The second moving unit stocker 620 is kept at the pressure of the chamber.

When a problem occurs with a given moving unit 430, the second moving unit stocker 620 is empty and readily accommodates (receives) the moving unit 430 after the substrate 2 is detached from the corresponding moving unit 430 at the unloading unit 300. Next, the first moving unit stocker 610 discharges the backup moving unit 430', which is accommodated therein, into the loading unit 200 to replace the moving unit 430 accommodated by the second moving unit stocker 620. This avoids the time delay involved in unsealing and resealing the main chamber. Of course, the plurality of other, still good moving unit 430 may simultaneously continue to be transported from the loading unit 200, through the deposition unit 100, and out to the unloading unit 300. Therefore, the first moving unit stocker 610 may discharge the backup moving unit 430' into the loading unit 200 at a time point at which the moving unit 430 accommodated in the second moving unit stocker 620 should be if the moving unit 430 were not accommodated by the second moving unit stocker 620.

However, since a deposition apparatus according to the present embodiment includes the first moving unit stocker 610 and the second moving unit stocker 620, the moving unit 430 may be effectively replaced within a short period of time without affecting the deposition source 110 by maintaining the first moving unit stocker 610 and the second moving unit stocker 620 at an atmosphere same as or similar to the interior of the chamber 101, discharging the moving unit 430 having the problem directly from the chamber 101 into an accommodating space within the second moving unit stocker 620, and discharging the backup moving unit 430' that is held in reserve in the first moving unit stocker 610 into the chamber 101. Furthermore, as the first moving unit stocker 610 and the second moving unit stocker 620 may be separated from each other and arranged independently, interferences thereby to paths in which the moving unit 430 and the backup moving unit 430' move may be effectively prevented. Furthermore, only the moving units 430 having problems are collected at the second moving unit stocker 620, the so collected moving unit 430 having problems may be handled effectively later.

Of course, even if there is no problem at the moving unit 430, which is detached from the substrates 2, if depositions are made onto the substrates 2 by using the moving unit 430 for a preset number of times, the second moving unit stocker 620 may accommodate those of the moving units 430 which have been used a predetermined number of times even before any problem occurs thereat and may discharge the backup moving unit 430' in the first moving unit stocker 610 into the loading unit 200.

Figure 6:
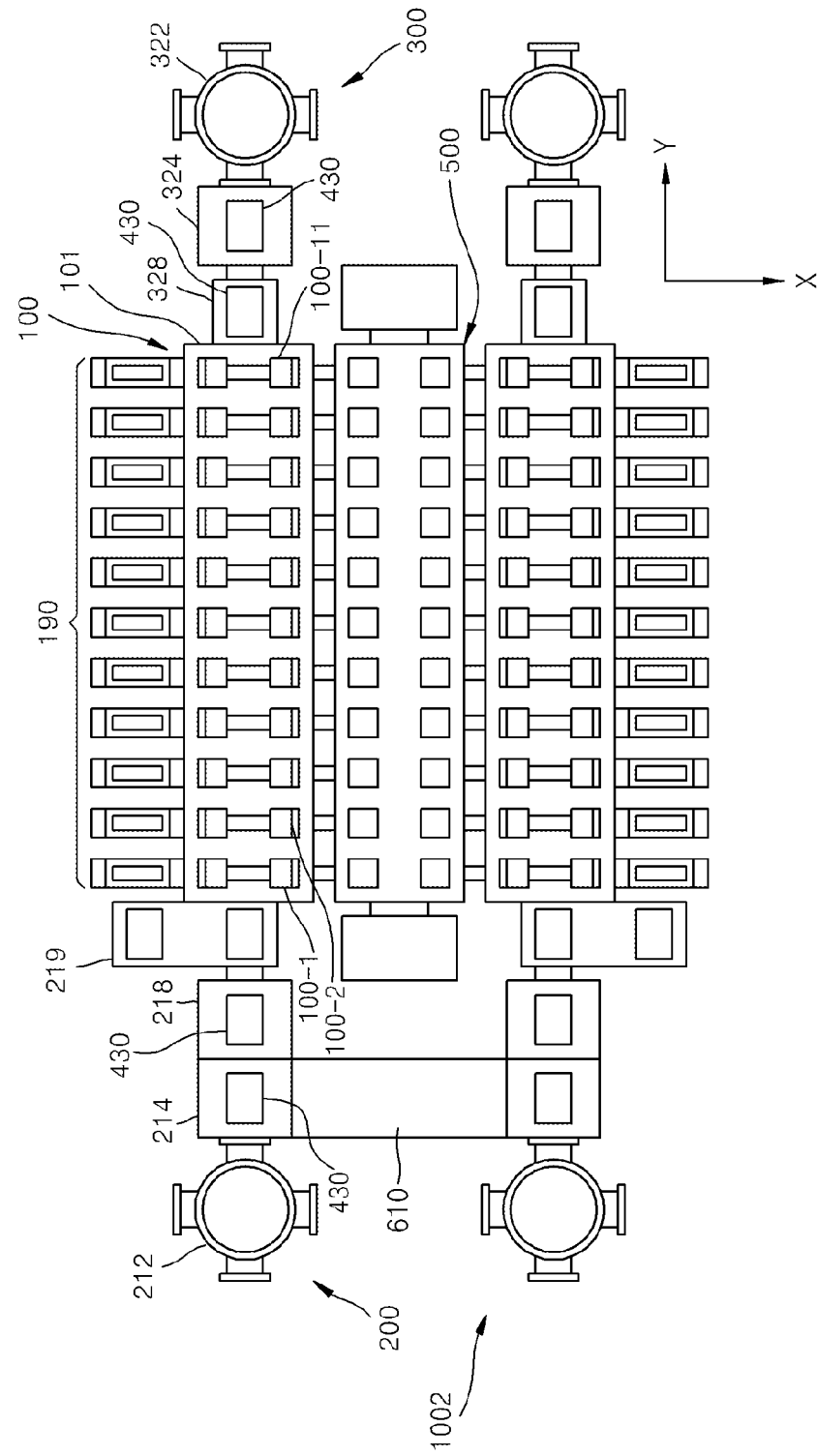
FIG. 6 is a lateral perspective view of a deposition unit of a deposition apparatus according to another embodiment of the present disclosure.

FIG. 6 is a schematic plan view of a deposition apparatus 1002 according to another embodiment of the present disclosure of invention.

FIG. 6 shows that, in the deposition apparatus 1002 according to the present embodiment, two deposition devices each including a respective loading unit 200, and a respective deposition unit 100, as well as a respective unloading unit 300, and the transporting unit 400 are arranged next to each other. In this case, the first moving unit stocker 610 may be arranged between the two deposition devices so as to be shared by both. In other words, by arranging the two deposition devices to share the first moving unit stocker 610, fabrication floor space may be utilized more efficiently than in a case where the each of two deposition devices has its own dedicated first moving unit stocker 610. Although not shown, if the deposition apparatus includes the second moving unit stocker 620, the second moving unit stocker 620 may also be arrange between the two deposition devices, so that the two deposition devices can similarly share the second moving unit stocker 620.

Although the above descriptions are mainly related to deposition apparatuses, the present teachings are not limited thereto. For example, the present teachings may also include a method of manufacturing an organic light emitting display apparatus by using the deposition apparatus.

A method of manufacturing an organic light emitting display apparatus according to another embodiment of the present disclosure may include transporting the moving unit 430 into the chamber 101 by using the first transporting unit 410 arranged to penetrate through the chamber 101 and forming a layer by discharging a deposition material onto the substrate 2 from the deposition assembly 100-1 while the deposition assembly 100-1 arranged inside the chamber 101 and the substrate 2 are a predetermined distance apart from each other and the first transporting unit 410 transports the substrate 2 relative to deposition assembly 100-1. Next, the moving unit 430, which is detached from the substrate 2, is transported back to the second transporting unit 420 arranged to penetrate through the chamber 101, and thus the moving unit 430 may be transported back and forth by the first transporting unit 410 and the second transporting unit 420

In the mass production method of manufacturing organic light emitting display devices, the deposition assembly 100-1 may have the structure as described above.

Here, the moving unit 430, from which the substrate 2 is detached, is transported by the second transporting unit 420 and temporarily accommodated in the first moving unit stocker 610, and the backup moving unit 430' in the first moving unit stocker 610 is discharged for use even if there is no problem with another of the moving units 430. Here, the discharging of the backup moving unit 430' may include making corresponding accommodation for the return-trip moving unit 430 from which the substrate 2 has been detached. Additionally, if a problem occurs with one of the moving units 430, the discharging also takes place of the backup moving unit 430' from the first moving unit stocker 610 to replace the defective one. Of course, if necessary, if depositions are made onto the substrates 2 by using the moving unit 430 for a preset number of times, the corresponding moving unit 430 may be accommodated in the first moving unit stocker 610 and the backup moving unit 430' in the first moving unit stocker 610 may be discharged to the loading unit 200, before a problem occurs at the corresponding moving unit 430

Accordingly, a given moving unit 430 may be effectively replaced for whatever reason and within a relatively short period of time (no need to repressurize the chamber) without affecting the other components of the deposition source 110.

A method of manufacturing an organic light emitting display apparatus according to another embodiment of the present disclosure may include transporting the moving unit 430, to which the substrate 2 is fixed, into the chamber 101 by using the first transporting unit 410 arranged to penetrate through the chamber 101 and forming a deposition layer by discharging a deposition material onto the substrate 2 from the deposition assembly 100-1 while the deposition assembly 100-1 arranged inside the chamber 101 and the substrate 2 are a predetermined distance apart from each other and the first transporting unit 410 transports the substrate 2 relative to deposition assembly 100-1. Next, the moving unit 430, which is detached from the substrate 2, is transported back to the second transporting unit 420 arranged to penetrate through the chamber 101, and thus the moving unit 430 may be transported back and forth by the first transporting unit 410 and the second transporting unit 420

Here, the moving unit 430, from which the substrate 2 is detached, transported by the second transporting unit 420 may be accommodated in the second moving unit stocker 620, and the backup moving unit 430' in the first moving unit stocker 610 may be discharged. Here, the moving unit 430, from which the substrate 2 is detached, transported by the second transporting unit 420 may be accommodated in the second moving unit stocker 620 if a problem occurs at the moving unit 430. Of course, if proactive problem avoidance is desired, after depositions are made onto the substrates 2 by using the moving unit 430 for a preset number of times, the corresponding moving unit 430 may be accommodated in the second moving unit stocker 620, before a problem occurs at the corresponding moving unit 430

Furthermore, the discharging of the backup moving unit 430' may be performed after the moving unit 430, from which the substrate 2 is detached, is accommodated in the second moving unit stocker 620. In this case, the plurality of moving unit 430 may be being simultaneously transported between the loading unit 200, the deposition unit 100, and the unloading unit 300. Therefore, the first moving unit stocker 610 may discharge the backup moving unit 430' into the loading unit 200 at a time point at which the moving unit 430 accommodated in the second moving unit stocker 620 should be if the moving unit 430 were not accommodated by the second moving unit stocker 620.

Accordingly, the moving unit 430 may be effectively replaced within a short period of time without affecting the other components of the deposition source 110.

Figure 7:
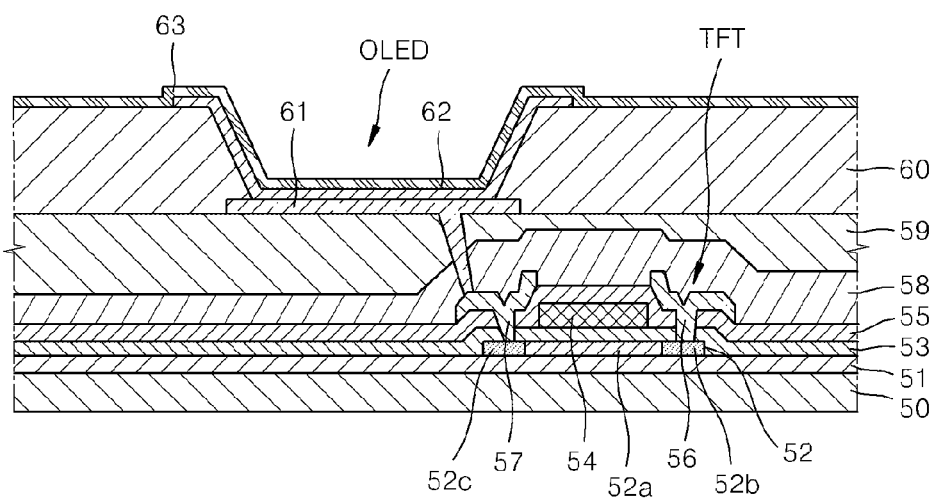
FIG. 7 is a schematic sectional view of an organic light emitting display apparatus manufactured by using the deposition apparatus of FIG. 1.

FIG. 7 is a schematic sectional view of an organic light emitting display device (OLEDD) manufactured by using the deposition apparatus of FIG. 1.

Referring to FIG. 7, components of the organic light emitting display apparatus are formed on a substrate 50. Here, the substrate 50 may be the substrate 2 as shown in FIG. 1 or a part of the substrate 2. The substrate 50 may be formed of a transparent material, e.g., a glass material, a plastic material, or a metal.

Common layers, such as a buffer layer 51, a gate insulation layer 53, and an interlayer insulation layer 55, may be formed to completely cover the top surface of the substrate 50, a patterned semiconductor layer 52 including a channel region 52a, a source contact region 52b, and a drain contact region 52b may be formed on the substrate 50, and a gate electrode 54, a source electrode 56, and a drain electrode 57, which constitute a TFT together with such a patterned semiconductor layer, may be formed on the substrate 50.

Furthermore, a protection layer 58 covering the TFT and a planarizing layer 59, which is arranged on the protection layer 58 and has a substantially flat top surface, may be formed to completely cover the top of substrate 50. A organic light emitting device (OLED) including a patterned pixel electrode 61, a counter electrode 63, which substantially corresponds to the top surface of the substrate 50, and a intermediate layer 62, which has a multi-layer structure, is interposed between the pixel electrode 61 and the counter electrode 63, and includes an emission layer, may be arranged on the planarizing layer 59. Of course, the intermediate layer 62 may be a common layer substantially corresponding to the top surface of the substrate 50, whereas the other layers may be patterned layers patterned to correspond to the pixel electrode 61. The pixel electrode 61 may be electrically connected to a TFT via a contact hole. Of course, a pixel defining layer 60, which covers edge portions of the pixel electrode 61 and defines each pixel region, may be formed on the planarizing layer 59 in substantial correspondence to the top surface of the substrate 50.

In such an organic light emitting display apparatus, at least a part of components thereof may be formed by using a deposition apparatus according to embodiments described above.

For example, the intermediate layer 62 may be formed by using a deposition layer according to embodiments described above. For example, a hole injection layer (HIL), a hole transport layer (HTL), an emission layer (EML), an electron transport layer (ETL), and an electron injection layer (EIL) that may be included in the intermediate layer 62 may be formed by using respective deposition methods and mass production apparatuses according to embodiments described above.

In other words, when each of layers of the intermediate layer 62 is formed, deposition may be performed by moving either a deposition assembly including a deposition source, a deposition nozzle unit, and a patterning slit sheet or a substrate relative to the other while the deposition assembly is arranged a predetermined distance apart from the substrate for deposition, that is, the substrate having formed thereon the pixel electrode 61.

If a plurality of patterning slits 131 are arranged in parallel along the x-axis direction in a patterning slit sheet, when a layer constituting the intermediate layer 62 is formed by using the patterning slit sheet, the layer may have a linear pattern. The layer may be an emission layer, for example. It is within the contemplation of the present disclosure to mass produce batches of light emitting devices having consistently essentially same deposited layers by using the deposition systems disclosed herein. The batches may include substrates of relatively long length (e.g., 40 inches or more) wherein the scan method of deposition is used.

As described above, the deposition apparatus as shown in FIG. 1, for example, is capable of performing deposition precisely in a preset region of a large-scale substrate. Therefore, the deposition apparatus as shown in FIG. 1, for example, may form the intermediate layer 62 precisely even on a 40 inch long substrate or a larger substrate for an organic light emitting display apparatus, thereby embodying a high quality organic light emitting display apparatus.

As described above, according to an embodiment of the present disclosure of invention, provided are: a deposition apparatus with significantly reduced maintenance time, a method of manufacturing an organic light emitting display apparatus on a reliable mass production basis, and an organic light emitting display apparatus. However, the present teachings are not limited thereto.

While the present disclosure of invention has been particularly provided with reference to exemplary embodiments thereof, it will be understood by those of ordinary skill in the art and in light of the foregoing that various changes in form and details may be made therein without departing from the spirit and scope of the present teachings.

What is claimed is:

1. A method of manufacturing organic light emitting display apparatus, the method comprising:
   transporting a moving unit, to which a substrate is detachably affixed, into a chamber by using a first transporting unit;
   forming a layer by discharging a deposition material onto the substrate from a deposition assembly disposed inside the chamber, the forming being performed while the substrate is spaced apart by a predetermined distance from the deposition assembly and while the first transporting unit is transporting the moving unit and the substrate relative to the deposition assembly;
   returning the moving unit, after it no longer has the substrate attached thereto, back to a loader for mating with a second substrate by using a second transporting unit; and
   accommodating an empty moving unit, which is detached from its corresponding substrate and is transported on a return trip by the second transporting unit, into a first moving unit stocker if the empty moving unit has a problem and discharging a backup moving unit from a second moving unit stocker.

2. The method of claim 1, wherein, if the problem occurs at the moving unit, which is detached from the substrate and is transported by the second transporting unit, the first moving unit stocker accommodates the moving unit at which the problem occurs and discharges the backup moving unit into the loading unit.

3. The method of claim 1, wherein, in forming a deposition layer on the substrate, the layer is formed as the substrate is moving relative to the corresponding deposition assembly, where the corresponding deposition assembly comprises a deposition source storing the material of the being formed deposition layer; a deposition nozzle unit, which is arranged above the deposition source and pointed toward the first transporting unit and includes deposition nozzles; and a patterning slit sheet, which is arranged to face the deposition nozzle unit, while the deposition assembly and the substrate are a predetermined distance apart from each other.

4. An organic light emitting display apparatus manufactured by the method of claim 1.

5. A method of manufacturing an organic light emitting display apparatus, the method comprising:
   transporting a moving unit, to which a substrate is detachably affixed, into a chamber by using a first transporting unit, which is arranged to penetrate through the chamber;
   forming a layer by discharging a deposition material onto the substrate from the deposition assembly, the forming being performed while the deposition assembly arranged inside the chamber and the substrate are a predetermined distance apart from each other and while the first transporting unit transports the moving unit and the substrate relative to the deposition assembly;
   transporting the moving unit, which is detached from the substrate, back by using a second transporting unit, which is arranged to penetrate through the chamber;
   accommodating the moving unit, which is detached from the substrate and transported by the second transporting unit, in a second moving unit stocker; and
   discharging a backup moving unit in the first moving unit stocker.

6. The method of claim 5, wherein, if a problem occurs with a given moving unit, the second moving unit stocker accommodates the given moving unit.

7. The method of claim 5, wherein the backup moving unit is discharged after the moving unit, which is detached from the substrate, is accommodated in the second moving unit stocker.

8. The method of claim 5, wherein, in the forming of the layer, the layer is formed as the substrate is moving relative to a deposition assembly, where the corresponding deposition assembly comprises a deposition source storing the material of the being formed deposition layer; a deposition nozzle unit, which is arranged above the deposition source and pointed toward the first transporting unit and includes deposition nozzles; and a patterning slit sheet, which is arranged to face the deposition nozzle unit, while the deposition assembly and the substrate are a predetermined spaced apart from each other.

* * * * *